US008675442B2

(12) United States Patent
Rao

(10) Patent No.: US 8,675,442 B2
(45) Date of Patent: Mar. 18, 2014

(54) ENERGY EFFICIENT MEMORY WITH RECONFIGURABLE DECODING

(75) Inventor: Hari M. Rao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 46 days.

(21) Appl. No.: 13/357,492

(22) Filed: Jan. 24, 2012

(65) Prior Publication Data

US 2013/0083610 A1   Apr. 4, 2013

Related U.S. Application Data

(60) Provisional application No. 61/542,861, filed on Oct. 4, 2011.

(51) Int. Cl.
  *G11C 8/00* (2006.01)
  *G11C 5/06* (2006.01)
  *G11C 7/10* (2006.01)

(52) U.S. Cl.
  USPC .............. 365/230.03; 365/63; 365/189.011; 365/230.01; 365/230.08

(58) Field of Classification Search
  USPC ................. 365/63, 230.01, 230.03, 230.08
  See application file for complete search history.

(56) References Cited

U.S. PATENT DOCUMENTS

| | | | |
|---|---|---|---|
| 6,490,221 B2 | 12/2002 | Furutani et al. | |
| 6,937,532 B2 | 8/2005 | Hatanaka et al. | |
| 7,791,976 B2 | 9/2010 | Rao et al. | |
| 2001/0014052 A1 | 8/2001 | Ayukawa et al. | |
| 2003/0204667 A1 | 10/2003 | Ji et al. | |
| 2006/0190678 A1 | 8/2006 | Butler et al. | |
| 2009/0323453 A1 | 12/2009 | Rao et al. | |

OTHER PUBLICATIONS

Nam Sung Kim, Krisztian Flautner, David Blaauw, and Trevor Mudge "Drowsy Instruction Caches" Proceedings of the 35th Annual IEEE/ACM International Symposium on Microarchitecture (Micro-35); 1072-4451/02, 2002.
Arimoto K, et al., "A Circuit Design of Intelligent CDRAM with Automatic Write Back Capability", VLSI Circuits, 1990. Digest of Technical Papers., 1990 Symposium on, IEEE, Jun. 7, 1990, pp. 79-80, XP032249766, DOI: 10.1109/VLSIC.1990.111104.
International Search Report and Written Opinion—PCT/US2012/058784—ISA/EPO—Jan. 16, 2013.

*Primary Examiner* — Ly D Pham
(74) *Attorney, Agent, or Firm* — Sam Talpalatsky; Nicholas J. Pauley; Joseph Agusta

(57) ABSTRACT

A sacrificial memory bank is added to a block of regular banks in a memory to reduce dynamic power consumption of the memory. The sacrificial bank is accessed by a set of bit lines that is substantially shorter than corresponding bit lines extending through all of the regular memory banks. Memory read and write operations, which are addressed to one of the regular banks, are deliberately redirected to the sacrificial bank having the short bit lines. Tracking circuitry identifies the regular bank that was addressed for each location in the sacrificial bank. Data is moved from the sacrificial bank to a regular bank only when a new write operation does not match the bank of the previous write operation. Dynamic power is reduced because locality of reference causes access to the sacrificial bank without having to access a regular bank for most memory read and write operations.

18 Claims, 7 Drawing Sheets

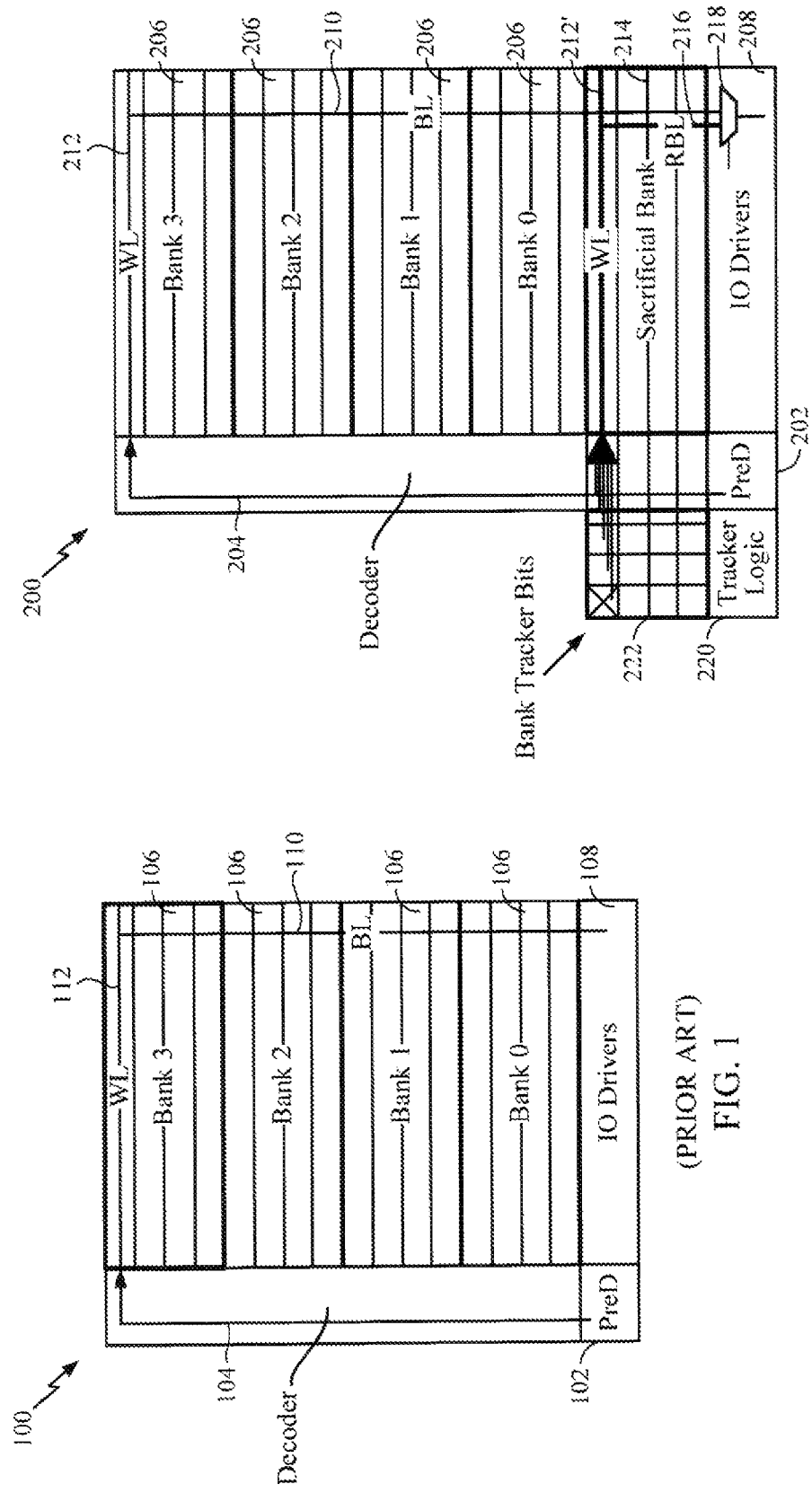

ENERGY EFFICIENT MEMORY WITH RECONFIGURABLE DECODING

CROSS REFERENCE TO RELATED APPLICATION

The present application claims the benefit of U.S. provisional patent application No. 61/542,861. to H. RAO, filed on Oct. 4, 2011.

TECHNICAL FIELD

The present disclosure relates to electronic memory operation and more specifically to systems and methods for reducing power consumption in memory operation.

BACKGROUND

Power consumption is a concern in electronic memory operations. Power consumption falls into two categories, namely, stand-by power and dynamic power. In the stand-by or quiescent mode, the memory uses the least power because neither read operations nor write operations are occurring. Dynamic power consumption occurs during switching when memory is accessed for reads and/or writes.

Memory power consumption can be reduced by limiting the switching frequency and/or reducing the line capacitance because:

$$P = C * V^2 * f * A$$

where P=dynamic power; C is line capacitance; V is the voltage applied to the line operated; f is the frequency of memory access; and A is the activity factor, i.e., the number of switches as a system cycles through reads and writes.

Often, memory power consumption is managed by dividing the memory into banks and then only enabling one bank at a time. One reason for creating banks is to reduce the amount of capacitance, and reduce switching activity which in turn reduces dynamic power. Frequency normally is not subject to control because it is desirable to operate the memory at high frequencies. Reducing voltage of operation is a very powerful technique to reduce dynamic power because a "cubic" effect results, with a concomitant decrease in frequency. Reducing voltage, however, impacts performance. Other techniques for reducing dynamic power have included limiting the swing of a signal, and reducing switching events for each cycle.

SUMMARY

A sacrificial memory bank is added to a block of regular banks in a memory to reduce dynamic power consumption of the memory. The sacrificial bank is accessed by a set of bit lines that is substantially shorter than corresponding bit lines extending through all of the regular memory banks. Memory read and write operations, which are addressed to one of the regular banks, are deliberately redirected to the sacrificial bank having the short bit lines. This avoids using longer bitlines to access the regular banks unless a conflict exits in the sacrificial bank. Tracking circuitry identifies the regular bank that was addressed for each location in the sacrificial bank. Data is moved from the sacrificial bank to a regular bank only when a new write operation does not match the bank of the previous write operation. Dynamic power is substantially reduced because locality of reference causes access to the sacrificial bank without having to access a regular bank (with longer bit lines) for most memory read and write operations.

A memory apparatus according to one aspect of the present disclosure includes a set of regular memory banks, a set of word lines coupled to each of the regular banks, a set of regular bit lines coupled to each of the regular banks, and a sacrificial memory bank in addition to the regular banks. The sacrificial bank is also coupled to the set of word lines. A set of sacrificial bank bit lines, which are shorter than the regular bit lines, are coupled to the sacrificial bank. Bank selection circuitry is coupled to the regular memory banks and to the sacrificial bank. The bank selection circuitry is configured to direct a memory operation to the sacrificial memory bank when a bank addressed in the memory operation is unset or matches a bank accessed by a previous memory operation for a corresponding word line.

Another aspect of the present disclosure includes a method for reducing energy consumed during memory access operations. The method includes receiving data along with a memory write address identifying a selected memory bank for the data within a block of regular memory banks and identifying a selected word line within the memory bank. The method further includes determining whether the selected memory bank matches a previous bank addressed in a previous write operation for the selected word line and writing the data to a sacrificial bank.

In yet another aspect, an apparatus for reducing energy consumed during memory access operations has means for receiving data along with a memory write address identifying a selected memory bank for the data within a block of regular memory banks and identifying a selected word line of a plurality of word lines within the memory bank. The apparatus also has means for determining whether the selected memory bank matches a previous bank addressed in a previous write operation for the selected word line. The apparatus further includes means for writing the data to a sacrificial bank.

The foregoing has outlined rather broadly the features and technical advantages of the present disclosure in order that the detailed description that follows may be better understood. Additional features and advantages will be described hereinafter which form the subject of the claims. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawings.

FIG. 1 is a block diagram illustrating a prior art generic memory.

FIG. 2 is a block diagram illustrating a memory architecture according to an aspect of the present disclosure.

DETAILED DESCRIPTION

Figure 3:
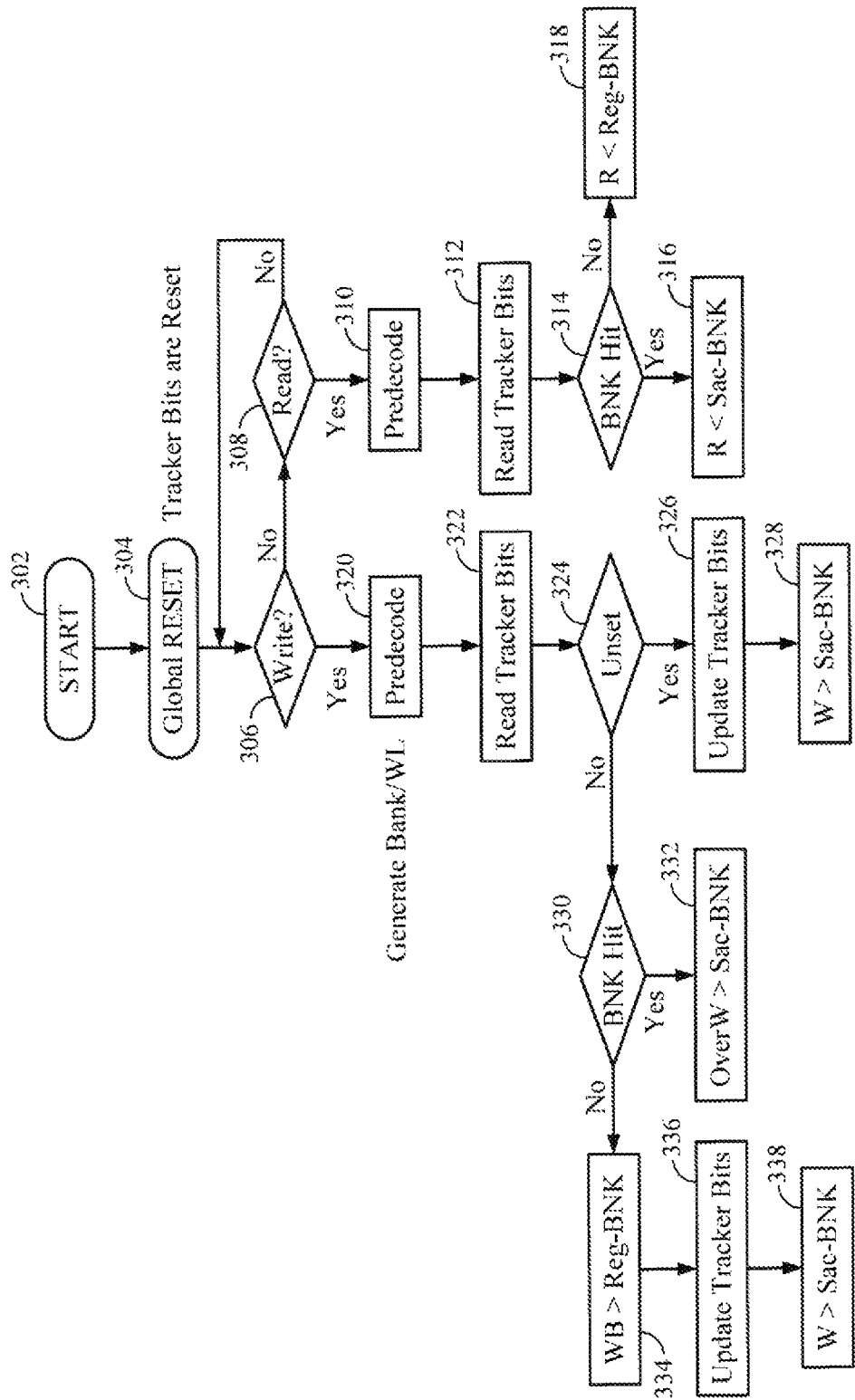
FIG. 3 is a process flow diagram illustrating a method for managing memory traffic to implement an efficient memory according to an aspect of the present disclosure.

FIG. 1 illustrates a prior art generic memory 100. The memory 100 can be, for example, a SRAM, DRAM, MRAM, or other memory type and includes a pre-decoder 102 coupled to a decoder 104 which is coupled to a group of substantially identical memory banks 106. Input/output drivers (I/O drivers) 108 are coupled to the pre-decoder 102. The I/O drivers 108 are also coupled to the banks 106 via long bitlines 110 that extend through all of the banks 106. A group of word lines 112 is replicated in each of the banks 106. When a program trace, which represents either a memory read operation or a Memory write operation for a memory address in the group of banks, is received at the I/O drivers 108, the memory address indicated by the trace is decoded by the pre-decoder 102 to generate a bank identifier (B) and a word line identifier (WL). The Bank/WL combination corresponds to the memory location being accessed. The I/O drivers 108 energize the word line WL in bank B from the pre-decoded address. Data can then be read from or written to a memory cell at the intersection of a bitline 110 and word line 112 in one of the banks.

Memory architectures are usually configured using groups of banks to facilitate efficient addressing schemes and to save power by allowing only one bank in a group to be accessed at a time. This allows the other banks to be inactive or to operate at low power levels when they are not being accessed. A bank that is being accessed consumes dynamic power to decode the memory address, energize a word line, energize a bit line and/or sense data. However, even banks that are not being accessed consume leakage power whenever the memory power supply is on.

Dynamic power in a memory is generally dominated by bitline switching power which is proportional to bitline capacitance and switching frequency. Therefore, as memory speeds increase, dynamic power is becoming a more significant component of memory power consumption. The bitline capacitance of a typical memory is quite large because the bitlines extending through all of the banks in a group are relatively long. Even in memory architectures that include hierarchical bit lines in which unused sections of a bitline can be switched off, all of the banks are still connected together with long common bitlines that increase dynamic power usage. When a particular bank is being addressed, some of the power is consumed due to the bitline loading caused by all of the other banks also connected to the long bit line.

One aspect of the present disclosure provides an improved memory architecture with an additional bank configured to substantially reduce dynamic power of the memory. The additional bank, referred to as a "sacrificial bank" can be accessed by a set of bit lines that is substantially shorter than corresponding bit lines extending through all of the regular memory banks in the block. Memory read and write operations, which are addressed to one of the regular banks, are deliberately redirected to the sacrificial bank with the short bit lines. This avoids using longer bitlines to access the regular bank unless a conflict exits in the sacrificial bank in which a new write operation does not match the bank of the previous write operation. Such conflicts occurs infrequently because, according to locality of reference principals, most write operations match the bank of the previous write operation.

Referring to FIG. 2, the memory 200 includes a pre-decoder 202 coupled to a decoder 204 which is coupled to a group of substantially identical regular banks 206. Input/output drivers (I/O drivers) 208 are coupled to the pre-decoder 202. The I/O drivers 208 are also coupled to the banks 206 via long bitlines 210 that extend from the I/O drivers 208 through all of the regular banks 206. A group of word lines 212 is replicated in each of the banks 206. The memory 200 also includes an additional bank 214 that is substantially identical to a regular bank 206. The group of word lines 212 is also replicated in the additional bank 214, the replicated word lines 212' will be referred to as "sacrificial word lines.". The additional bank 214 is referred to as a "sacrificial bank" because it involves the sacrifice of some additional space and a small amount of leakage power to save a large amount of dynamic power.

The sacrificial bank 214 is coupled to the I/O drivers 208 and is not coupled to the long bitlines 210. Instead, a different set of bit lines 216 that are physically much shorter than the long bitlines 210 are coupled between the I/O drivers 208 and the sacrificial bank 214. Tracker logic circuitry 220 is coupled to the pre-decoder 202, the regular banks 206 and the sacrificial bank 214. The tracker logic circuitry 220 is coupled to a bank of tracker bits 222 which can store a tracker bit for each regular bank address (Bank/WL). For each word line 212, only one tracker bit may be set at a time to indicate the bank address for the previous write operation on that word line 212.

When a program trace for a memory address in the group of banks is received at the I/O drivers 208, the memory address is decoded from the trace by the pre-decoder 202 to generate a bank identifier and a word line identifier (WL) in which the Bank/WL combination correspond to the memory location being accessed. Memory read and write operations may access either the sacrificial bank 214 or one of the regular banks 206 depending on the state of a tracker bit for the Bank/WL address of the memory operation. A multiplexer 218 selects one of the shorter bit lines 216 when the sacrificial bank 214 is being accessed or a corresponding one of the longer bit lines 210 when one of the regular banks 206 is being accessed. Because the regular banks 206 and the sacrificial bank 214 share the same address decoding by the pre-decoder 202, memory access to a sacrificial bank may be performed on the same memory access cycle as a regular bank access.

The amount of power that can be saved by accessing the sacrificial bank 214 instead of one of the regular bank 206 depends on the difference in length between the short bit lines 216 and the longer bit lines 210 which depends on the number of regular banks 206 in a group for each sacrificial bank 214. For example, if the group includes four regular banks 206 as shown in FIG. 2, the shorter bitlines are ¼ of the length of the longer bit lines so memory operations accessing the sacrificial bank 214 use only about ¼ of the power that would be used for a memory operation that accesses one of the regular banks 206.

Aspects of the present disclosure provide a method of using a sacrificial bank 214 to substantially reduce the dynamic power consumption of a memory 200. The method includes redirecting memory operations to the sacrificial bank 214 rather than to the regular bank 206 indicated by the pre-decoded address of the memory operation. The regular banks 206 are accessed only when a memory operation addresses a different regular bank 206 than the previous memory operation for the same word line. The method takes advantage of the principal of locality of reference which recognizes that a vast majority of memory operations are directed to the same bank as a previous operation for the same word line.

According to aspects of the present disclosure, traffic to the sacrificial bank may be substantially increased or maximized to reduce power consumption. Program traces are tracked and address decoding is reconfigured so that either the sacrificial bank 214 or a regular bank 206 is accessed depending on the tracking information. Redirecting memory operations to the sacrificial bank saves energy by limiting regular bank access, limiting the global bit line switching associated with regular bank access, and limiting the use of longer word lines 212.

A method for managing memory traffic according to aspects of the present disclosure by tracking program traces is described with reference to FIG. 3. The method 300 starts in block 302. A global reset may be performed in block 304 in which an array of tracker bits is cleared. The global reset may occur upon start up or at other times according to control of higher level program policies, for example.

When a trace comes into the memory block, the method determines whether the trace is a write operation in block 306 or a read operation in block 308. The trace includes an encoded memory address for the data being written or read. If the trace is read operation, the encoded memory address of the trace is pre-decoded in block 310. The pre-decoding converts the encoded memory address to generate identification of a bank and a word line where data is to be read from.

Upon identifying the bank and word line of the incoming trace, a set of tracker bits is read in block 312 to determine if the bank and word line (Bank/WL) combination is already represented in the sacrificial bank. The tracker bits store the previous cycle's address (Bank/WL) and are compared with the incoming Bank/WL in block 314. If the incoming Bank/WL matches a Bank/WL read from the tracker bits, then a bank hit (BNK Hit) is indicated. The bank hit means that the incoming Bank/WL is already represented in the sacrificial bank.

If the comparison in block 314 results in a bank hit, then the data may be read from the sacrificial bank in block 316, thereby saving energy. If the comparison in block 314 does not result in a bank hit, then the data to be read is not stored in the sacrificial bank and therefore is retrieved from the one of the regular banks in block 318, i.e., using the longer bit line.

If the trace is write operation, the encoded memory address of the trace is pre-decoded in block 320. The pre-decoding converts the encoded memory address to generate identification of a bank and a word line where data is intended to be written.

Upon identifying the bank and word line of the incoming trace, a set of tracker bits is read in block 322 to determine if the bank and word line (Bank/WL) combination is already represented in the sacrificial bank.

In block 324, the method determines whether the tracker bits are in an unset state to determine whether the incoming trace is the very first cycle after a global reset. If the tracker bits are in an unset state, which indicates that nothing was written and nothing was read in a previous cycle, then the sacrificial bank is free to be written.

The tracker bits are updated in block 326 to indicate data will be written for the Bank/WL to the sacrificial bank for the incoming write operation. In block 328, data is written to the sacrificial bank at the location indicated by the word line of the incoming trace address. The tracker bits store the bank identifier portion of the Bank/WL decoded from the incoming address to record which regular bank the data would have been written to if it had not been diverted to the sacrificial bank. In other words, each word line in the sacrificial bank substitutes for a word line having the same identifier in one of the regular banks. The word line decoder for the sacrificial bank is the same as the word line decoder of the regular banks so the sacrificial bank does not distinguish which bank's data it is storing.

Because the sacrificial bank is a same size replication of any one of the regular banks, the tracker bits only store the bank identifying portion of the Bank/WL (address). The word line portion in the sacrificial bank is the same as the word line portion in the regular bank in accordance with the incoming trace address. If the sacrificial bank is implemented with only four regular banks as shown in FIG. 2, for example, only four bits are used to track the bank for each word line.

If it is determined in block 326 that the tracker bits are not unset, then the tracker bits are compared with the incoming trace's bank identifier in block 330. If the incoming trace's bank identifier matches the bank identified by the tracker bits for the incoming trace's word line, then a bank hit (BNK Hit) is indicated. The bank hit means that the incoming Bank/WL is already represented in the sacrificial bank. In other words, the most recent operation involving the word line of the incoming trace also involved the same bank, i.e., the same address. Therefore, the incoming data was intended to overwrite the data in the sacrificial bank. In block 332, the data of the incoming trace can overwrite the previous information in the sacrificial bank Bank/WL location and the tracker bits can remain unchanged.

If the incoming trace's bank identifier does not match the bank identified by the tracker bits for the incoming trace's word line, then a bank hit (BNK Hit) is not indicated. This means that there is some data already stored in the word line of the sacrificial bank to which the incoming trace is directed, but the stored information was originally addressed to a different bank then the incoming trace is directed. Because the new data and the old data in the sacrificial bank correspond to two different banks, the incoming data was not intended to overwrite the data stored in the sacrificial bank. In this case, in block 334, the old data is first moved, i.e., read from the sacrificial bank and written to the regular bank to which it was originally directed as indicated by the tracker bits. Then the tracker bits are updated in block 336 to identify the bank to which the incoming data is addressed. In block 338, the incoming data can then be safely written to the incoming word line in the sacrificial bank.

These operations performed in a single memory cycle are worth the few extra steps because of the significant power savings that result from leveraging locality of reference. Because of locality of reference, there is a very high probability that subsequent memory operations for a word line will be directed to the same bank as the previous operation for that word line. For example, the trace is likely to almost immediately go back and read what it has just written. Thus, the energy spent setting and checking tracker bits and periodically swapping out data to a regular bank is offset by increasing/maximizing traffic to the sacrificial bank. This substantially reduces the active energy that would be spent activating long bit lines in the regular banks for every memory access operation.

Figure 4:
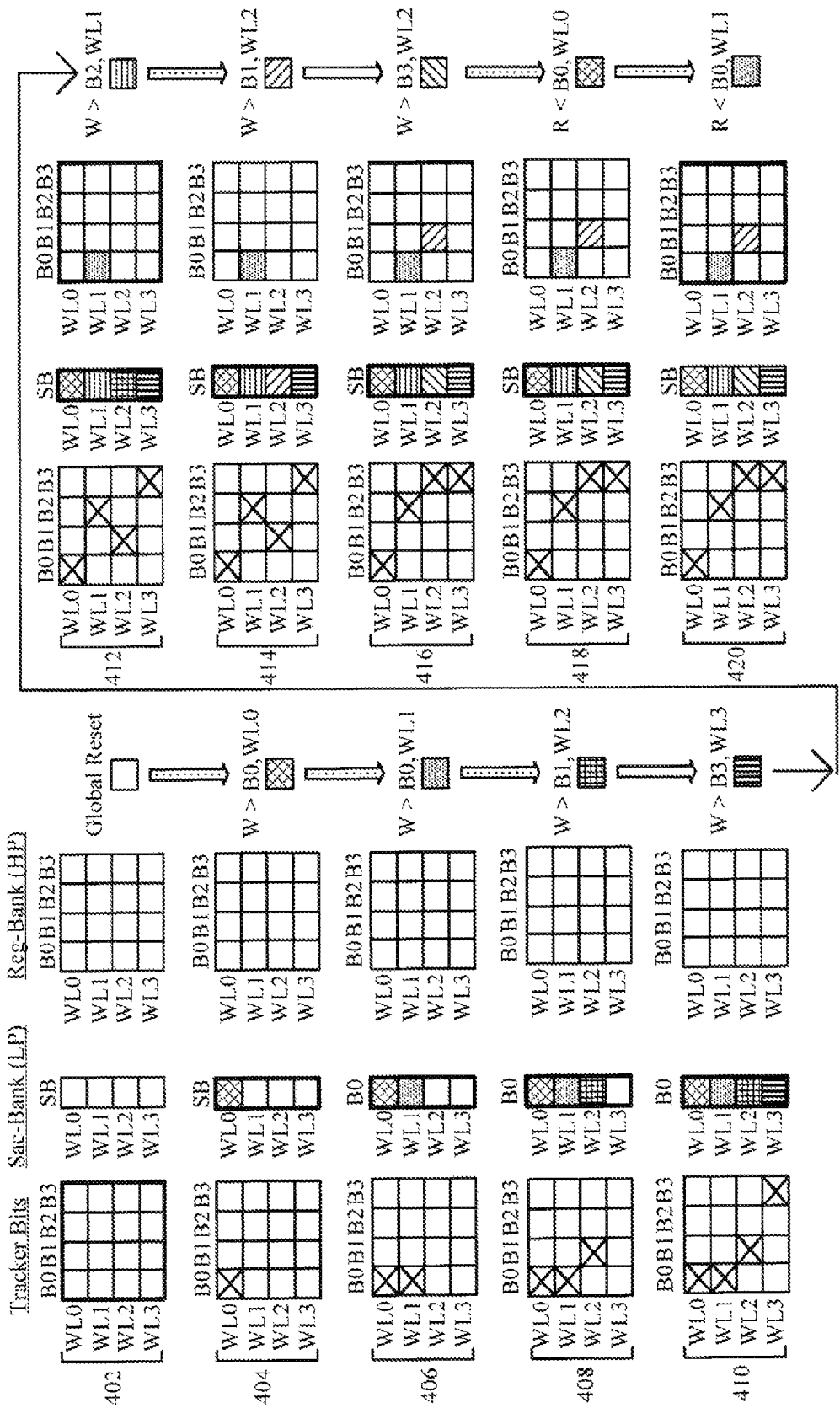
FIG. 4 is a diagram illustrating the use of tracker bits to redirect memory write operations according to an aspect of the present disclosure.

FIG. 4 illustrates the use of a tracker bit for each word line to indicate which regular bank the data stored in the sacrificial bank was originally addressed, and shows the movement of data between the sacrificial bank and the regular bank using the process diagrammed in FIG. 3.

In a first state 402, after a global reset, no tracker bits are set, no data is stored in the sacrificial bank (SB) and no data is stored in any of the regular banks (B0, B1, B2, B3).

In a second state 404, after a write operation addressed to regular bank B0, WL0, data for the write operation is stored in the WL0 of the sacrificial bank rather than in regular bank B0. No data is stored in any of the regular banks. The tracker bit for WL0 is set to indicate B0 as the bank to which the data in WL0 of the sacrificial bank was addressed.

In a third state 406, after, a write operation to B0, WL1, data for the write operation is stored in WL1 of the sacrificial bank rather than in regular bank B0. The tracker bit for WL1 is set to indicate B0 as the regular bank to which the data in WL1 of the sacrificial bank was addressed.

In a fourth state 408, after a write operation to B1, WL2, data for the write operation is stored in WL2 of the sacrificial bank rather than in regular bank B1. The tracker bit for WL2 is set to indicate B1 as the regular bank to which the data in WL2 of the sacrificial bank was addressed.

In a fifth state 410, after a write operation to B3, WL3, data for the write operation is stored in WL3 of the sacrificial bank rather than in regular bank B1. The tracker bit for WL3 is set to indicate B3 as the regular bank to which the data in WL3 of the sacrificial bank was addressed.

In a sixth state 412, a write operation is addressed to B2, WL1 which is a different bank than the bank address of the previous data stored in WL1 of the sacrificial bank. In other words, the incoming data to WL1 was not intended to overwrite the data previously stored in WL1 of the sacrificial bank. In this case, the previously stored data is read from WL1 of the sacrificial bank and written to WL1 of regular bank B0 to which it was originally addressed as determined by reading the tracker bit for WL1. The new data is then stored in WL1 of the sacrificial bank and the tracker bit for WL1 is moved to indicate that the data now stored in WL1 of the sacrificial bank was addressed to regular bank B2.

In a seventh state 414, after another write operation to B1, WL2, data for the write operation is stored in WL2 of the sacrificial bank rather than in regular bank B1. Because the tracker bit for WL2 was already set to indicate B1 as the regular bank to which the previous data in WL2 of the sacrificial bank had been addressed, the new data for WL2 overwrites the previous data for WL2 in the sacrificial bank. In this case there is no need to preserve the previous data stored in WL2 of the sacrificial bank, because the new data intended to overwrite without preserving the same data for WL2 in the regular bank B1.

In an eighth state 416, a write operation is addressed to B3, WL2 which is a different bank than the bank address of the previous data stored in WL2 of the sacrificial bank. The incoming data to WL2 was not intended to overwrite the data previously stored in WL2 of the sacrificial bank. In this case, the previously stored data is read from WL2 of the sacrificial bank and written to WL2 of regular bank B1 to which it was originally addressed as determined by reading the tracker bit for WL2.

The new data is then stored in WL2 of the sacrificial bank and the tracker bit for WL2 is moved to indicate that the data now stored in WL2 of the sacrificial bank was addressed to regular bank B3. In a ninth state 418, a read operation is addressed to B0, WL0. Because the tracker bit for WL0 indicates that the data stored in WL0 of the sacrificial bank was addressed to the same regular bank, i.e., B0, the data is read from the WL0 of the sacrificial bank.

In a tenth state 420, a read operation is addressed to B0, WL1. Because the tracker bit for WL1 indicates that the data stored in WL1 of the sacrificial bank was addressed to B3 which does not match the address of the read operation, data is read from WL1 of the regular bank B0 rather than from the sacrificial bank.

Figure 5:
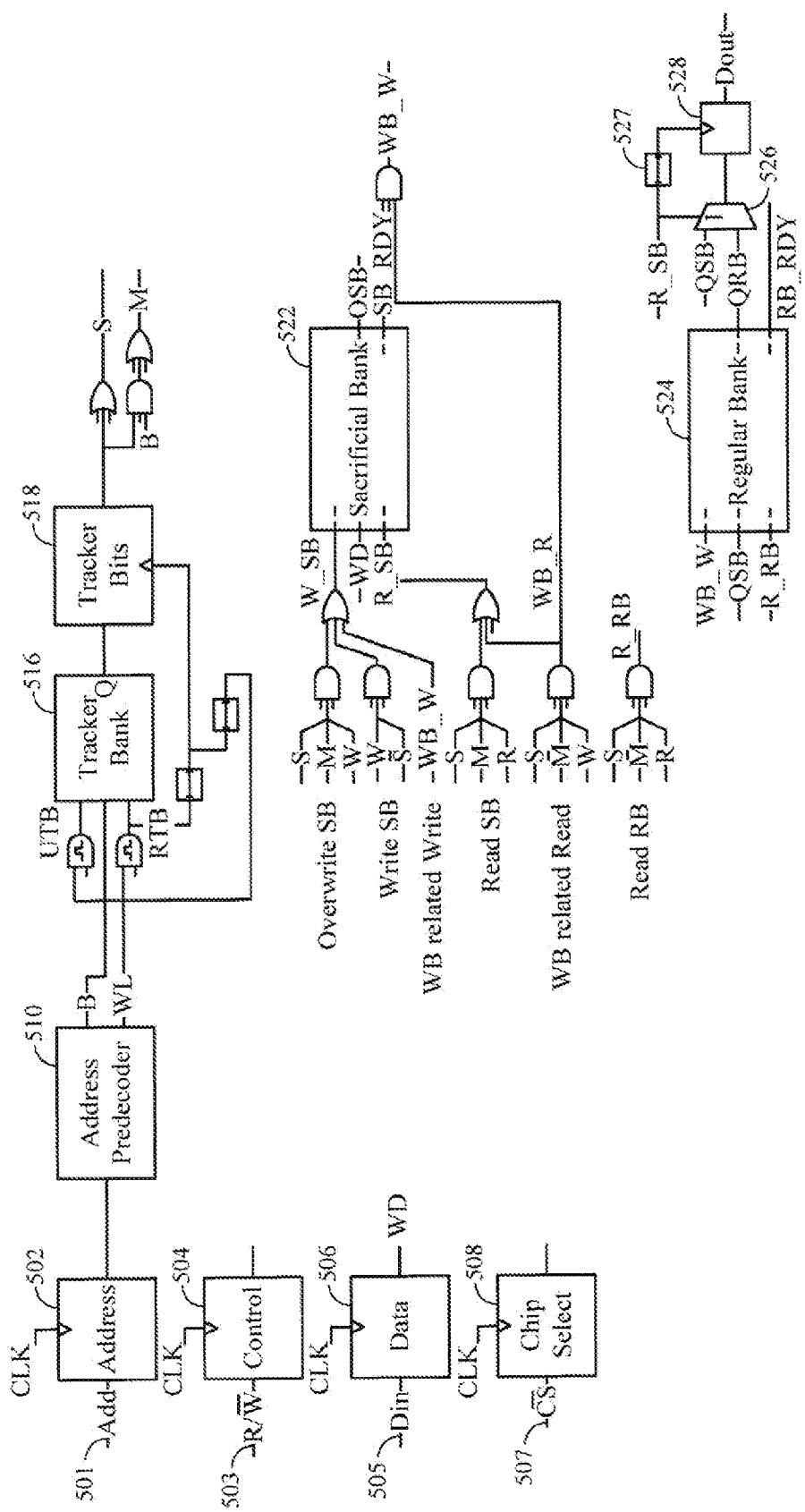
FIG. 5 is a circuit diagram showing one circuit configuration for managing memory traffic according to an aspect of the present disclosure.

A memory apparatus for implementing a sacrificial bank according to aspects of the present disclosure is described with reference to the schematic circuit diagram shown in FIG. 5. The memory apparatus includes address lines 501, coupled to an address flip flop 502, control lines 503 coupled to a control flip flop 504, and data lines 505 connected to a data flip flop 506 which capture information from an incoming trace. A chip select line 507 is coupled to a chip select flip flop 508. A chip select signal (CS) on the chip select line 507 enables operation of the memory apparatus when a memory operation is directed to the address space of the memory apparatus.

Information into the memory apparatus on the address lines 501, control lines 503, and data lines 505 is captured by flip flops 502, 504, 506 upon a rising edge of a clock signal. An address predecoder 510 is coupled to the address flip flop 502. The address predecoder 510 pre-decodes address information to generate a bank identifier (B) 512 and a word line identifier (WL) 514. A tracker bank 516 is coupled to the address predecoder 510 to receive and store the predecoded bank identifier (B). A tracker bit flip flop 518 is coupled to the tracker bank 516. Tracker logic circuitry coupled to the input side of the tracker bank 516 and to the clock input of the tracker bit flip flop 518 receives the word line identifier (WL) from the address predecoder 510. The tracker logic circuitry is configured to provide a read tracker bit (RTB) signal to the tracker bank 516. The RTB signal causes the tracker bank 516 to output previously stored tracker bits (Q) to the tracker bit flip flop 518. The previously stored tracker bits identify the bank that was addressed upon the previous write operation for the word line addressed in the incoming trace. The tracker logic circuitry is also configured to provide a clocking signal to the tracker bit flip flop 518 after providing the RTB signal to the tracker bank 516. The clocking signal causes the tracker bit flip flop 518 to output the previously stored tracker bits for the word line addressed in the incoming trace.

The tracker logic circuitry is also coupled to the control flip flop 504. A control signal from the control flip flop indicates whether the incoming trace is a read operation (R) or a write operation (W). If the control signal indicates the incoming trace is a write operation (W), the tracker logic circuitry provides an update tracker bit (UTB) signal to the tracker bank 516 after providing the clocking signal. The UTB signal causes the tracker bank 516 to receive the bank identifier (B) and to store tracker bits corresponding to the bank identifier (B) of the incoming trace.

Bank match circuitry compares the tracker bits stored in the tracker bit flip flop 518 with the bank identifier (B) of the incoming trace from the address predecoder 510. The bank match circuitry is configured to generate a bank match indicator (M) if the tracker bits stored in the tracker bit flip flop 518 match the bank identifier (B) of the incoming trace. Additional logic circuitry generates a set indicator (S) if the tracker bits stored in the tracker bit flip flop 518 are set.

Combinational logic circuitry coupled to a sacrificial bank 522 and a regular bank 524 receives the set indication (S), match indicator (M) and a control signal (R) or (W) from the control flip flop 504. The combinational logic circuitry causes data (WD) from the data flip flop 506 to be written to the sacrificial bank 522 if a write operation is indicated (W) and the set indicator (S) is low indicating a not-set tracker bit. This circumstance corresponds to a Write SB operation as shown in block 328 in FIG. 3.

The combinational logic circuitry also causes data (WD) to be written to the sacrificial bank 522 if a write operation is indicated (W), the set indicator (S) indicates a set tracker bit, and the match indicator (M) indicates a match between the bank identifier (B) and tracker bit for the incoming word line. This circumstance corresponds to an overwrite sacrificial bank operation as shown in block 332 of FIG. 3.

The combinational logic circuitry also causes data (QSB) to be read from the sacrificial bank 522 and written to the regular bank 524 if a write operation is indicated (W), the set indicator (S) indicates a set tracker bit, and the match indicator (M) is low indicating no match between the bank identifier (B) and tracker bit for the incoming word line. In this circumstance, the combinational logic circuitry generates a signal for a write back related read operation (WB_R) and a sacrificial bank read signal (R_SB). In response to the sacrificial bank read signal (R_SB), the sacrificial bank 522 provides the data to be read (QSB) along with a ready signal (SB_RDY) to the combinational logic circuitry. In response to the SB_RDY signal and the WB_R signal, the combinational logic circuitry generates a write back write signal (WB_W). In response to the WB_W signal, the regular bank 524 stores the data (QSB) from the sacrificial bank 522. This circumstance corresponds to the write-back related read operation and regular bank write operation shown in block 334 of FIG. 3.

The combinational logic circuitry also responds to the WB_W signal by generating a sacrificial bank write signal (W_SB). This causes data from the data flip flop 506 to be written to the sacrificial bank 522 when data from the sacrificial bank (QSB) is written to the regular bank 524. This corresponds to the write operation shown in block 338 of FIG. 3.

The combinational logic circuitry also causes data to be read from the sacrificial bank 522 if a read operation is indicated (R), the set indicator (S) indicates a tracker bit is set, and the match indicator (M) indicates a match between the bank identifier (B) and tracker bit for the incoming word line. In this circumstance, the combinational logic circuitry generates the sacrificial bank read signal (R_SB). In response to the sacrificial bank read signal (R_SB), the sacrificial bank 522 provides the data to be read (QSB) along with a sacrificial bank ready signal (SB_RDY) to the combinational logic circuitry. This circumstance corresponds to a read sacrificial bank operation as shown in block 316 of FIG. 3.

The combinational logic circuitry causes data to be read from the regular bank 524 if a read operation is indicated (R), the set indicator (S) indicates a tracker bit is set, and the match indicator (M) indicates no match between the bank identifier (B) and tracker bit for the incoming word line. In this circumstance, the combinational logic circuitry generates a regular bank read signal (RB_R). In response to the regular bank read signal (RB_R), the regular bank 524 provides data (QRB) to be read along with a regular bank ready signal (RB_RDY). This circumstance corresponds to a read regular bank operation as shown in block 318 of FIG. 3.

Multiplexor circuitry 526 is coupled to the sacrificial bank 522 and to the regular bank 524. The multiplexor circuitry 526 receives the data (QSB) from the sacrificial bank 522 and the data (QRB) from the regular bank 524. The multiplexor circuitry 526 is coupled to the combinational logic circuitry and configured to receive the read sacrificial bank (R_SB) signal as its control input. In response to the R_SB signal, the multiplexor circuitry 526 outputs the data (QSB) from the sacrificial bank 522. When the R_SB signal is not provided, the multiplexor circuitry 526 outputs the data (QRB) from the regular bank 524.

An output flip flop 528 is coupled to the output of the multiplexor circuitry 526. A delay element 527 is coupled to the combinational logic circuitry and to the output flip flop 528. In response to the R_SB signal, the delay element provides a control signal to the output flip flop 528 which causes the output flip flop 528 to store the multiplexor output after allowing the multiplexor output to settle. Data stored in the output flip flop provides the output of the memory apparatus (Dout).

Figure 6:
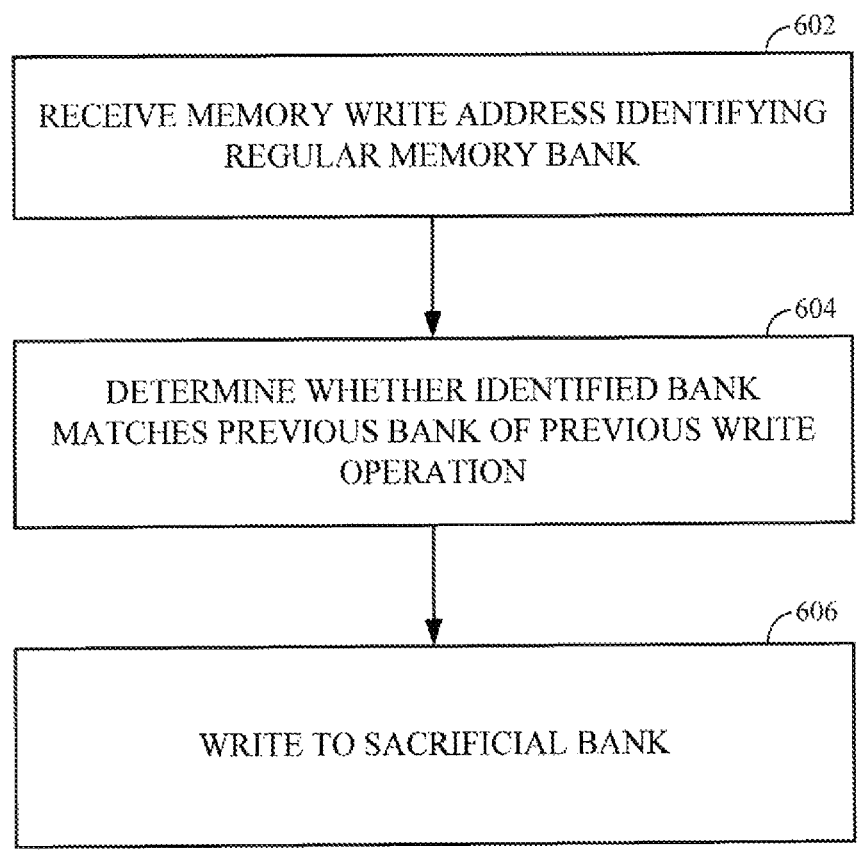
FIG. 6 is a process flow diagram illustrating a method for reducing energy consumed in memory access operations according to an aspect of the present disclosure.

A method for reducing energy consumed in memory access operations according to an aspect of the present disclosure is described with reference to FIG. 6. In block 602, data along with a memory write address are received. The memory address identifies a selected memory bank for the data within a block of regular memory banks and identifies a selected word line within the memory bank. At block 604, it is determined whether the selected memory bank matches a previous bank addressed in a previous write operation for the selected word line. At block 606, the data is written to a sacrificial bank.

Aspects of the present disclosure include an apparatus for reducing energy consumed during memory access operations. The apparatus includes means for receiving data along with a memory write address identifying a selected memory bank for the data within a block of regular memory banks and identifying a selected word line of a plurality of word lines within the memory bank. The apparatus also includes means for determining whether the selected memory bank matches a previous bank addressed in a previous write operation for the selected word line and means for writing the data to a sacrificial bank. Referring to FIG. 5, the means for receiving data along with a memory write address may be address lines 501 and data lines 505, for example. The means for identifying a selected word line may be the address predecoder 510. The means for determining whether the selected memory bank matches a previous bank addressed in a previous write operation for the selected word line may be the bank match circuitry shown in FIG. 5, for example.

According to aspects of the present disclosure, the means for writing the data may include, means for writing of previous data from the sacrificial bank to the previous bank when the selected bank does not match the previous bank, and subsequently performing the low power write to the sacrificial bank. The means for writing the data may include the combinational logic circuitry shown in FIG. 5, for example. The apparatus may also include means for updating tracker bits for the selected word line to identify the selected memory bank as a target memory bank for the data. The means for updating tracker bits may include the tracker logic circuitry shown in FIG. 5, for example. In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 7:
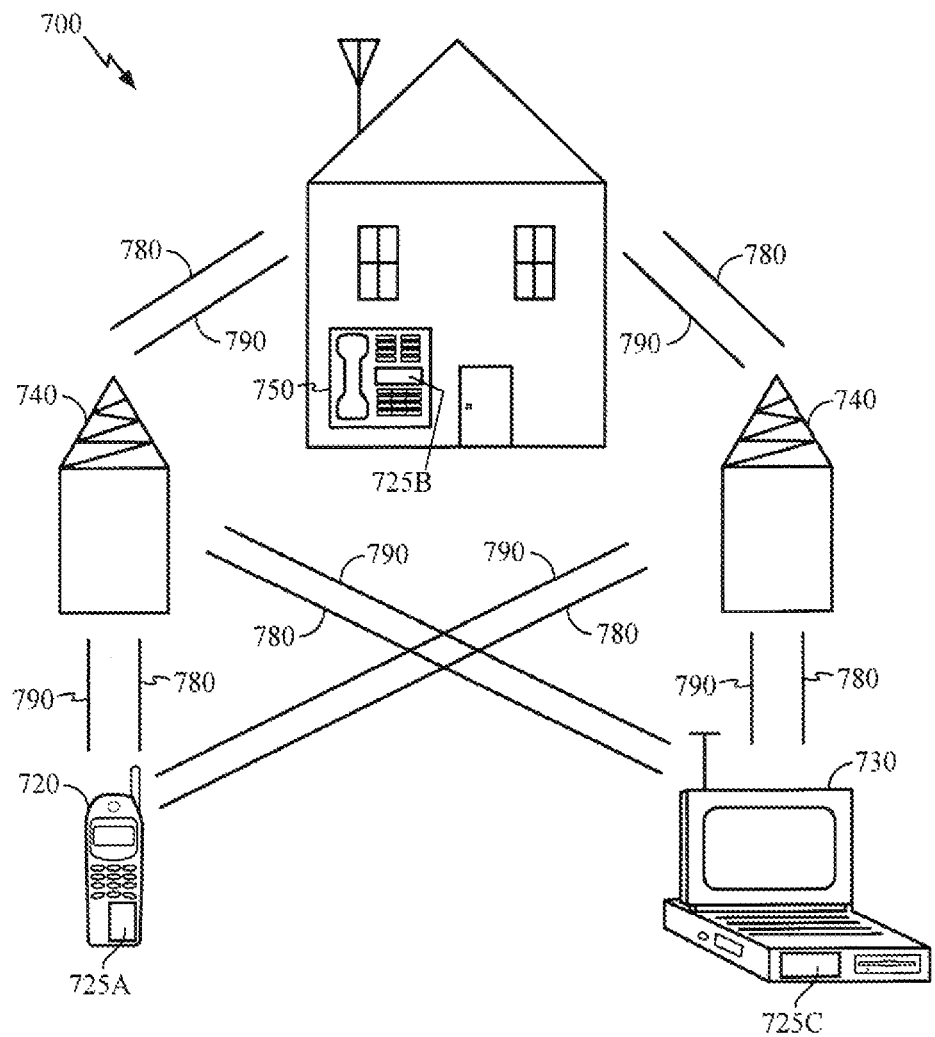
FIG. 7 is a block diagram showing an exemplary wireless communication system in which aspects of the disclosure may be advantageously employed.

FIG. 7 shows an exemplary wireless communication system 700 in which an aspect of the disclosure may be advantageously employed. For purposes of illustration, FIG. 7 shows three remote units 720, 730, and 750 and two base stations 740. It will be recognized that typical wireless communication systems may have many more remote units and base stations. Remote units 720, 730, and 750 include improved reconfigurable decoding 725A, 725B, and 725C, respectively, which are aspects of the disclosure as discussed further below. FIG. 7 shows forward link signals 780 from the base stations 740 and the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 7 illustrates remote units according to the teachings of the disclosure, the disclosure is not limited to these exemplary illustrated units. The disclosure may be suitably employed in any device which includes improved reconfigurable decoding.

Figure 8:
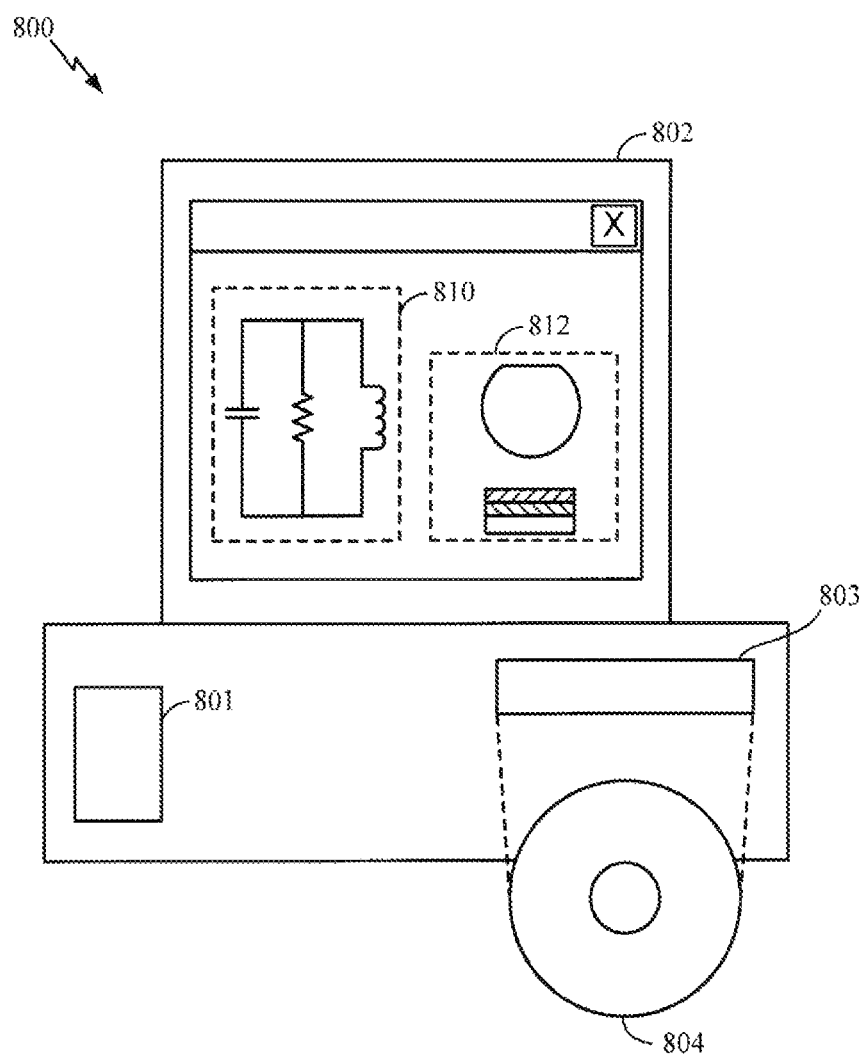
FIG. 8 is a block diagram illustrating a design workstation used for circuit, layout, and logic design of a memory according to one aspect of the present disclosure.

FIG. 8 is a block diagram illustrating a design workstation used for circuit, layout, and logic design of a semiconductor component, such as the memory disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as discussed above. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the spirit and scope of the disclosure, as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A memory apparatus, comprising:
    a plurality of regular memory banks;
    a plurality of word lines coupled to each of the regular banks;
    a plurality of regular bit lines coupled to each of the regular banks;
    a sacrificial memory bank in addition to the regular banks, the sacrificial bank coupled to the plurality of word lines;
    a plurality of sacrificial bank bit lines shorter than the regular bit lines and coupled to the sacrificial bank; and
    bank selection circuitry coupled to the plurality of regular memory banks and to the sacrificial bank, the bank selection circuitry configured to direct a memory operation to the sacrificial additional memory bank when a bank addressed in the memory operation is unset or matches a bank accessed by a previous memory operation for a corresponding word line.

2. The memory apparatus of claim 1, further comprising:
    tracking circuitry coupled to the plurality of regular memory banks and to the sacrificial bank, the tracker circuitry configured to store tracker bits indicating one of the regular banks for each of the word lines, the bank selection circuitry coupled to the tracking circuitry and configured to direct memory operations to the sacrificial bank or one of the regular banks in response to the tracker bits.

3. The memory apparatus of claim 2, in which the tracker bits identify one of the regular banks corresponding to a previous memory write trace received by the memory apparatus for each word line.

4. The memory apparatus of claim 2, in which the bank selection circuitry includes comparison circuitry configured to indicate a bank match when a bank addressed in a memory operation matches the bank indicated by the tracker bits for a corresponding word line.

5. The memory apparatus of claim 2, further comprising:
    a multiplexer coupled to the bank selection circuitry and configured to select one of the regular bit lines for each of the memory operations directed by the bank selection circuitry to one of the regular banks and to select one of the sacrificial bank bit lines for each of the memory operations directed by the bank selection circuitry to the sacrificial bank.

6. The memory apparatus claim 1, integrated in at least one of a mobile phone, a set top box, a music player, a video player, an entertainment unit, a navigation device, a computer, a hand-held personal communication systems (PCS) unit, a portable data unit, and a fixed location data unit.

7. A method for reducing energy consumed during memory access operations, comprising:

receiving data along with a memory write address identifying a selected memory bank for the data within a block of regular memory banks and identifying a selected word line of a plurality of word lines within the memory bank;

determining whether the selected memory bank matches a previous bank addressed in a previous write operation for the selected word line; and writing the data to a sacrificial bank.

8. The method of claim 7, in which writing the data comprises:

writing of previous data from the sacrificial bank to the previous bank when the selected bank does not match the previous bank, and subsequently performing the low power write to the sacrificial bank.

9. The method of claim 8, further comprising updating tracker bits for the selected word line to identify the selected memory bank as a target memory bank for the data.

10. The method of claim 7, in which writing the data comprises overwriting data in the sacrificial bank when the selected memory bank matches the previous bank.

11. The method of claim 7, further comprising:

receiving a memory read address identifying a selected read memory bank in the block of regular memory banks and identifying a selected read word line of the plurality of word lines;

determining whether the selected read bank matches the previous bank addressed in the previous write operation for the selected read word line; and performing a low power read from the selected read word line in the sacrificial bank when the selected read bank matches the previous bank.

12. The method of claim 7, further comprising:

receiving a memory read address identifying a selected read memory bank in the block of regular memory banks and identifying a selected read word line of the plurality of word lines;

determining whether the selected read bank matches the previous bank addressed in the previous write operation for the selected read word line; and performing a regular power read from the selected read word line in the selected regular memory bank when the selected read bank does not match the previous bank.

13. The method of claim 7, in which determining whether the selected memory bank matches comprises reading sacrificial bank tracker bits for the selected word line.

14. The method of claim 7, further comprising integrating the sacrificial memory bank into at least one of a mobile phone, a set top box, a music player, a video player, an entertainment unit, a navigation device, a computer, a handheld personal communication systems (PCS) unit, a portable data unit, and a fixed location data unit.

15. An apparatus for reducing energy consumed during memory access operations, comprising:

means for receiving data along with a memory write address identifying a selected memory bank for the data within a block of regular memory banks and identifying a selected word line of a plurality of word lines within the memory bank;

means for determining whether the selected memory bank matches a previous bank addressed in a previous write operation for the selected word line; and means for writing the data to a sacrificial bank.

16. The apparatus of claim 15, in which the means for writing the data comprises:

means for writing previous data from the sacrificial bank to the previous bank when the selected bank does not match the previous bank, and subsequently performing the low power write to the sacrificial bank.

17. The apparatus of claim 16, further comprising means for updating tracker bits for the selected word line to identify the selected memory bank as a target memory bank for the data.

18. The apparatus claim 15, integrated in at least one of a mobile phone, a set top box, a music player, a video player, an entertainment unit, a navigation device, a computer, a handheld personal communication systems (PCS) unit, a portable data unit, and a fixed location data unit.

* * * * *